United States Patent [19]
Judell

[11] Patent Number: 5,165,094
[45] Date of Patent: Nov. 17, 1992

[54] PARTIALLY CONSTRAINED MINIMUM ENERGY STATE CONTROLLER

[75] Inventor: Neil H. Judell, Andover, Mass.

[73] Assignee: Hampshire Instruments, Inc., Rochester, N.Y.

[21] Appl. No.: 526,566

[22] Filed: May 21, 1990

[51] Int. Cl.⁵ ............................................. G21K 5/00
[52] U.S. Cl. .................................. 378/34; 378/160; 378/205; 250/442.11; 318/128; 364/474.35; 364/508
[58] Field of Search ............... 250/491.1, 398, 442.1, 250/412.2, 548; 378/34, 35, 160; 318/128; 364/508, 474.35; 356/400; 248/50

[56] References Cited

U.S. PATENT DOCUMENTS

| | | | |
|---|---|---|---|
| 4,514,858 | 4/1985 | Novak | 378/34 |
| 4,539,695 | 9/1985 | La Fiandra | 378/34 |
| 4,644,172 | 2/1987 | Sandland et al. | 356/400 |
| 4,782,236 | 11/1988 | Chitayat | 250/440.1 |
| 4,929,874 | 5/1990 | Minzuno et al. | 318/128 |
| 4,956,789 | 9/1990 | Hamada et al. | 364/142 |
| 4,969,169 | 11/1990 | Forsyth et al. | 378/34 |

Primary Examiner—Janice A. Howell
Assistant Examiner—Kim-Kwok Chu
Attorney, Agent, or Firm—Harry W. Barron

[57] ABSTRACT

A lithographic system, having a stepper and exposure station built on a block of granite attached to the ground using isolation legs, includes a servo control system for providing signals a motor associated with the stepper to control the movement of the stepper. The control system includes means to calculate a filter formula used to generate the control signals, which formula is calculated in response to the initial velocity, the movement of the stepper and a certain time between discrete movements, so that a minimum amount of energy is utilized. The filter formula requires that the difference in the velocity of the base and the stepper be zero at the time the stepper reaches the final position. Where time is short, both the base and the stepper initially move with the same velocity and end with the same velocity, and an array processor calculates the time varying filter formula.

13 Claims, 1 Drawing Sheet

PARTIALLY CONSTRAINED MINIMUM ENERGY STATE CONTROLLER

BACKGROUND OF THE INVENTION

1. Field of the Invention

This invention relates to a motor controller and more particularly to such a controller having a servo system used for moving one element over a floating second element, such as a lithography stepper over a base isolated from ground motion, so as to bring the two elements to relative rest within a given time using a minimum of energy.

2. Description of The Prior Art

In the past, lithography machines have been built utilizing a large base, which base included an extremely heavy granite block firmly attached to the ground, and which block had one very flat and smooth surface. Most lithography systems typically include a mechanism, known as a stepper, for holding and moving a wafer in discrete steps over the flat surface of the granite base so that one section at a time of the wafer is exposed to energy. In the past, the energy of choice was ultraviolet light. However recent advances in semiconductor technology have resulted in the necessity to utilize shorter wavelength energy sources, such as X-rays, in order to pattern smaller and smaller features on the wafers.

The ability to pattern smaller features on semiconductors wafers has created a whole new set of constraints on lithographic systems. One such constraint is that it now is necessary to isolate the granite block from simple and everyday ground motion because of the high degree of precision required in the semiconductor fabrication processes. Such motion, for example, may result from vehicles, such as large trucks or trains, in the neighborhood where the lithographic machine is being used. With traditional lithographic machine construction, any slight ground movement is translated directly to the machine and could cause misalignments or other problems in the modern day precision machines. Further, in the case of a point source X-ray lithography system, the gap between the mask and wafer is critical and is maintained nominally at twenty microns. Thus, slight ground movements can cause problems in maintaining the integrity of the mask to wafer gap.

One solution to the ground motion problem discussed above is to isolate the granite base from the ground on isolation legs, similar in construction to shock absorbers used on heavy vehicles. Inclusion of these shock absorbers unfortunately cause a new problem of a damped oscillation of the granite base whenever the stepper is moved. Servo-controllers have been used in the past to solve these problems and generally operate by providing reverse acceleration signals to the item being moved to reduce the base oscillations. However, these techniques require significant time and energy in order to bring the entire system to rest so that it can be useful. What is needed is a more acceptable system which permits more frequent movements to occur and with the utilization of less energy.

SUMMARY OF THE INVENTION

In accordance with one aspect of this invention, there is provided, in a system having a movable member for being moved by controllable moving means over surface of a non-secured base and further having position detecting means for providing signals manifesting the position of the movable member relative to the base, the improvement of means for providing a control signal to the movable member to move the movable member to a desired position on the base. The control signal is such that the relative difference in the velocity of the base and the movable member is zero at the time the movable member reaches the desired position.

BRIEF DESCRIPTION OF THE DRAWINGS

One preferred embodiment of this invention is hereafter described with specific reference being made to the following Figures, in which.

DETAILED DESCRIPTION OF A PREFERRED EMBODIMENT

Figure 1:
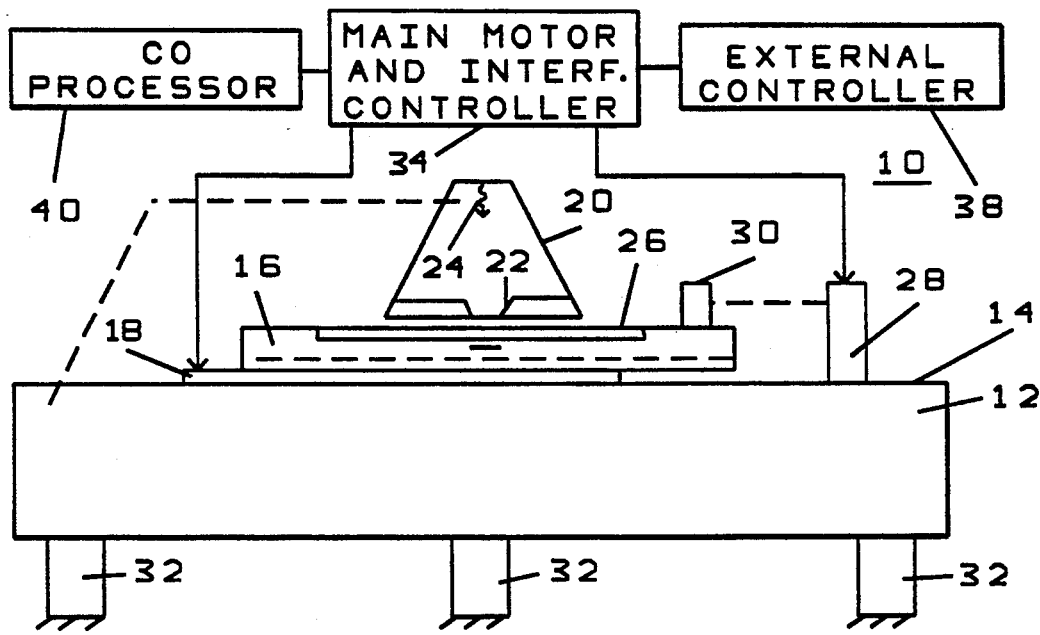
FIG. 1 is mechanical block diagram of the various elements of a lithography system.

Referring to FIG. 1, a mechanical block diagram of a lithography machine 10 is shown. For, example lithography machine 10 may be similar to the X-Ray lithography machine described in U.S. Pat. No. 4,870,668 in the name of Robert D. Frankel et al and entitled, "Gap Sensing/Adjustment Apparatus And Method For A Lithography Machine". The basic structural element upon which machine 10 is built is a massive base 12, such as a block of granite, having the upper surface 14 thereof polished so as to be very flat and smooth. A stepper assembly 16 is positioned to be movable over surface 14 over air bearings included therewith. Thus, there is only a small, but finite, amount of friction between stepper assembly 16 and surface 14. An induction motor 18 is further mounted on base 12 and may be energized in a conventional manner to drive stepper assembly 16 in both the X and Y directions.

An energy source 20 is also included with lithography machine 10. Source 20 may be an X-ray source, as described in the aforementioned Frankel et al patent, or it may be an ultraviolet light source. Source 20 is mechanically affixed to base 12, as indicated by the dashed line between source 20 and base 12. Source 20 includes a mask 22 through which energy, such as X-rays 24, are passed to expose a pattern on a resist coated wafer 26. Mask 22 should be capable of permitting features as small as one half of a micron to be exposed on wafer 26. Because semiconductor devices are made of various layers of such features, it is necessary to be able to align mask 22 with respect to wafer 26 to within one tenths of a micron, or less. In addition, where lithography machine 20 is an X-ray type lithography machine, it is important to maintain the gap between mask 22 and wafer 26 at a precise and constant value.

Also positioned on surface 14 of base 12 is a interferometer 28 and a mirror 30, associated with interferometer 28, is positioned on stepper assembly 16. In practice, two interferometers 28 and two mirrors 30, one for the X direction and one for Y direction, will be provided, although only one of each is shown in FIG. 1. As is well known, an interferometer and its associated mirror measures distance very accurately. Thus, by knowing the starting position of stepper assembly 16, the movement of stepper assembly 16 can be monitored.

Base 12 is maintained above the ground by six (only three of which are shown) isolation legs 32. Each of the legs 32 may include servo valve assisted gas springs and the legs 32 are designed for supporting loads up to 6000 or more pounds. When each leg 32 is affixed to base 12, both X and Y lateral damped motion can occur. Thus, base 12 becomes isolated from the ground. The purpose of legs 32 is to absorb ground motion and thereby prevent such ground motion from interfering with the precision required in order to fabricate semiconductor components.

Stepper assembly 16 is moved by motor 18 and motor 18 is, in turn, controlled by signals provided by main motor and interferometer controller 34. Main controller 34 also receives signals from interferometer 28 and uses the information manifested by the interferometer 28 signals, as well as other information discussed hereafter, in determining the appropriate motor control signals it provides to motor 18.

Because of the coupling between legs 32 and base 12 and the fact that a certain amount of friction exists between stepper 16 and surface 14, each time stepper assembly 16 is moved, a certain amount of force is transferred to base 12, and thereby causes base 12 to move in the direction of movement of stepper assembly 16. The movement of base 12, of course, is because it is not solidly affixed to the ground in view of the presence of isolation legs 32. The movement of base 12, in turn, then causes a transfer of force to stepper assembly 16, thereby causing additional movement of stepper assembly 16. Of course, the transferred movement becomes damped with respect to time and ultimately, the lithography system 10 settles to a stationary and stable state.

In order to have stepper assembly 16 move to a desired location and expose a pattern at the desired section of wafer 26, one must wait until the entire system settles and then make adjustments to stepper assembly 16 to correct for movements caused by the forces transferred between stepper assembly 16 and base 12. The time to settle, of course depends upon the physical characteristics of the system, such as the motor 18 torque constant, the masses of the stepper assembly 16 and base 12, the spring constant restoring force and damping restoring force of the isolation legs 32, and any other resonances in the system. Of course, each of these characteristics can be measured and the proper amount of energy to be applied to motor 18 can be calculated in order to bring lithographic system 10 to rest at the earliest time. In such event, an external controller 38 may be used to generate a filter signal and to apply such filter signal to main controller 34 to be used by the main controller 34 when generating the signals used to control motor 18.

According to the subject invention, the energy to be applied to the motor 18 may be calculated so as to minimize the energy applied and yet permit settling within a given time period. More specifically, the invention includes selecting the path of stepper assembly 16 to be followed and the form of the filter to be used for generating the proper motor control signals that cause stepper assembly 16 to arrive at the correct position on surface 14 within the time allowed.

In modern control theory, the state of a system can be described as a vector, as follows:

$$\vec{x} = \begin{bmatrix} \text{Stepper Absolute Position} \\ \text{Stepper Absolute Velocity} \\ \text{Base Absolute Position} \\ \text{Base Absolute Velocity} \end{bmatrix}$$

If the lateral spring restoring force of the isolation legs 32 is defined as K and the lateral damping restoring force of the isolation legs 32 is defined as D, the mass of the stepper assembly 16 as Ms and the mass of the base as Mb, then:

$$\frac{dx}{dt} = \begin{bmatrix} \text{Stepper Absolute Velocity} \\ \text{Stepper Absolute Acceleration} \\ \text{Base Absolute Velocity} \\ \text{Base Absolute Acceleration} \end{bmatrix} = \vec{A}x + \vec{C}u$$

where u is the force applied to the motor 18 and where, $$\vec{A} = \begin{bmatrix} 0 & 1 & 0 & 0 \\ 0 & 0 & 0 & 0 \\ 0 & 0 & 0 & 1 \\ 0 & 0 & -K/Mg & -D/Mg \end{bmatrix} \text{ and } \vec{C} = \begin{bmatrix} 0 \\ 1/Ms \\ 0 \\ -1/Mg \end{bmatrix}$$

In practice, the above vector equations should be calculated to account for the fact that discrete time samples of the system are utilized, and it thus takes the form:

$$x(n) = \vec{M}x(n-1) + Bu(n)$$

When utilizing a modern state controller, such as controller 34, the initial state of the system is X(0) and the goal is to find the sequence of motor control signals u(n) which will yield a desired final state Xf at a final instant of time, n=Nf. Normally, the final state Xf is chosen so that $$Xf = \begin{bmatrix} \text{desired ending position} \\ 0 \\ 0 \\ 0 \end{bmatrix}$$

Under this constraint, the minimum energy which can be put in the system to achieve the desired result is:

$$\sum_{i=1}^{Nf} u(n)^2$$

which yields a solution:

$$\vec{G} = \left[ \sum_{i=1}^{Nf} M^{(Nf-1)} BB^T (M^{(Nf-1)})^T \right]^{-1} [Xd - M^{(Nf)}(X(0))]$$

and $$u(k) = \vec{B^T}(\vec{M^{(Nf-k)}})^T\vec{G}$$

This is a well known result of control theory.

In using the above solution to move stepper assembly 16 to a desired position, it is wasteful of both time and/or energy in getting the base 12 back to its home position and at rest at the same time that stepper assembly 16 arrives at its desired position. However, for the lithographic applications described above, the extra condition is not needed. What is needed is that, at the time an exposure is to occur, the relative position of stepper assembly 16 be at the desired position on base 12 and that the stepper assembly 16 and base 12 be at rest with respect to one another. This may be viewed as the final constraint, that is $$K(Xf - Xd) + 0$$

where Xf is the final state of the system and $$Xd = \begin{bmatrix} \text{desired ending position} \\ 0 \\ 0 \\ 0 \end{bmatrix}$$

and $$\vec{K} = \begin{bmatrix} 1 & 0 & -1 & 0 \\ 0 & 1 & 0 & -1 \end{bmatrix}.$$

In general, if K is any matrix whose rank is equal to its number of rows, then the minimization of energy under the partial constraint can be solved by Lagrangian multipliers as follows:

$$\text{minimize} = \sum_{i=1}^{Nf} u(n)^2 + \vec{L}\vec{K}(Xf - Xd)$$

under the constraint:

$$\vec{K}(Xf - Xd) = 0$$

This equation may then be linearly solved. If $$Xn = (\vec{GK}^T K) + M^{Nf}x(0)$$

where, $$G = \left[ \sum_{i=1}^{Nf} M^{(Nf-1)} BB^T (M^{(Nf-1)})^T \right]$$

and $$Q = (KGK^T)^{-1}(KXd - KM^{Nf}X(0))$$

then, the sequence of motor control signals provided by main controller 34 to motor 18 may be expressed as:

$$u(k) =$$

$$B^T (M^{(Nf-k)})^T \left[ \sum_{i=1}^{Nf} M^{(Nf-1)} BB^T (M^{(Nf-1)})^T \right]^{-1} [Xn - M^{(Nf)}x(0)]$$

Referring again to FIG. 1, the manner of obtaining the best energy/time performance is accomplished by providing external controller 38 coupled with main controller 34. Main controller 34 includes a digital filter to provide a correction factor to the signals provided to drive motor 18. External controller 38 is used to calculate a digital filter formula and to apply that formula to the digital filter in main controller 34. In addition, external controller 38 calculates the required trajectory for the movement of stepper assembly 16. At the required time for movement, main controller 34 receives the calculated filter information and trajectory information from external controller 38 and provides the proper motor control signals to motor 18.

Figure 2A:
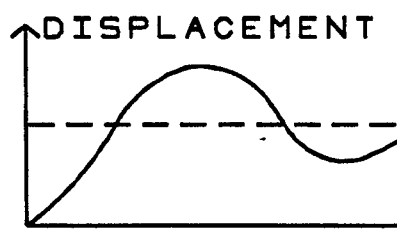
FIG. 2(a) and 2(b) constitute a pair of graphs with respect to time of the distance d moved by the stepper assembly shown in FIG. 1 in response to the force F utilizing the control systems of the prior art.
Figure 2B:
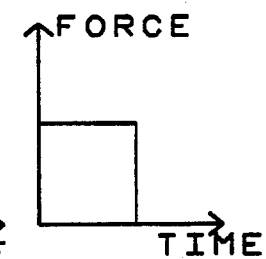
Figure 3A:
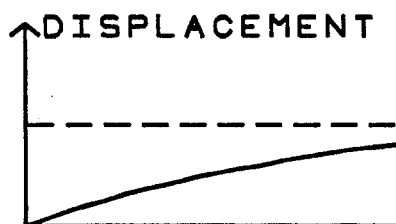
FIG. 3(a) and 3(b) constitute a pair of graphs with respect to time of the distance d moved by the stepper assembly shown in FIG. 1 in response to the force F when utilizing the inventive control system of this invention.
Figure 3B:
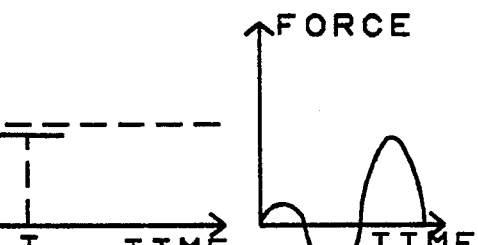

Referring now to FIGS. 2(a), 2(b), 3(a) and 3(b), curves with respect to time (t) of the displacement (d) of stepper assembly 16 and the force (F) required to cause such displacement are shown. Specifically, FIG. 2(a) represents the trajectory, that is, the relative distance between the mirror 30 and interferometer 28 as stepper assembly 16 approaches a movement of a distance D, where the movement of stepper assembly 16 utilizes the minimum amount of force or energy, as shown in FIG. 2(b). As seen, the time required for all movement to cease is relatively long, primarily due to the movement of base 12. FIG. 3(a) represents the trajectory for a move of stepper assembly 16 using additional energy, but requiring a much shorter trajectory. As seen, the trajectory is relatively smooth and approaches the desired location D in time T. In order to accomplish the FIG. 3(a) trajectory, the curve of the force F (energy) applied to motor 18 is shown in FIG. 3(b). As seen, a small force in the generally desired direction, followed by a negative force opposite to the desired direction and finally a larger force in the desired direction occurs. Generally, the smaller the time T, the greater the total amount of energy expended. Thus, the proper value of T should be used in the calculation of the last given equation by external controller 38 in order to use the minimum energy necessary to obtain a desired movement in a desired time.

In some instances, the time T becomes so short, that an unacceptably large amount of energy is expended. In order to reduce the energy, the calculation may be modified to consider the actual set of circumstances. In the simple situation, where the stepper assembly 16 comes to complete rest prior to the exposure, the calculations are basic and can be handled by a conventional microprocessor in external controller 38. However, as the time T becomes shorter, other factors must be considered. For example, it is not necessary that the stepper assembly 16 come to a complete rest, relative to ground, between movements. It is only necessary that the desired position of stepper assembly have been reached and that the relative velocity between the stepper assembly 16 and base 12 be zero. Thus, it is possible that both the base 12 and stepper assembly 16 can be moving in unison at the time the mask 22 and the proper section of wafer 26 are aligned and exposed.

With this additional constraint removed, filter formulas to permit shorter times T can be calculated. However, this involves calculations in a time varying formula and a variance in the trajectory dependent upon variable initial conditions. The computational load for this calculation is beyond the capacity of a conventional microprocessor and to assist in these calculation, a floating point co-processor 40 is provided. Co-processor 40 will be coupled directly with main controller 34 and will be provided with the real time interferometer 28 position readings. With this information, co-processor 40 will calculate the necessary trajectory and filter formula and provide this information to main controller 34.

What is claimed is:

1. In a system having a movable member for being moved by controllable moving means over a surface of a non-secured base, said system further having position detecting means for providing signals manifesting the position of said movable member relative to said base, the improvement comprising:

means for providing a control signal to said movable member to move said movable member to a desired position on said base, said control signal being such that the relative difference in the velocity of said base and said movable member is zero at the time said movable member reaches said desired position;

said velocity of said movable means and of said base being finite at the time said movable member reaches said desired position.

2. The invention according to claim 1 wherein said means for providing further includes filter means for filtering said control signal.

3. The invention according to claim 1 wherein said means for providing includes:

means responsive to the position of said movable member and to a filter signal for generating said control signal; and means for calculating and generating said filter signal for reducing the energy to move said movable member between the initial position and the desired position of said movable member within a certain time period and for providing said calculated signal to said means for generating.

4. The invention according to claim 1 wherein said control signal is provided in response to the desired trajectory of said movable member and the time required for said movable member to reach said desired position.

5. A lithography machine for providing signals for exposing a resist covered semiconductor wafer, one section at a time, as one step in the process of fabricating semiconductor devices, said machine including:

a base having at least one flat surface;

isolation means affixed between said base and mechanical ground so as to permit said base to move with respect to ground with a certain damped spring restoring force;

means for generating exposing energy along a given path, said means for generating energy being solidly affixed to said base;

a stepper for holding said wafer, said stepper being positioned to be moved over said one flat surface;

motor means connected to said base and said stepper for moving said stepper relative to said base from an initial position to a desired position, said movement being determined by a control signal applied thereto; and means to generate said control signal so that at said desired position, the difference in the velocity of said stepper and base is zero and the velocity of said stepper and base is nonzero.

6. The invention according to claim 5 wherein said means to generate said control signal responds to a filter formula and a trajectory formula for generating said control signals in a manner to reduce the energy expended by said motor means in moving said stepper to said desired position.

7. The invention according to claim 5 wherein said means to generate said control signal is determined in response to the initial velocity of said stepper and base.

8. The invention according to claim 5 wherein said means to generate said control signal responds to a time varying filter formula and a trajectory formula for generating said control signals to reduce the energy expended by said motor means in moving said stepper to said desired position, said filter formula being based upon the initial velocity of said stepper and base.

9. The invention according to claim 8 wherein said filter formula is based an initial condition that said base and said stepper moving at the same velocity.

10. A method of moving a member over a over a surface of a non-secured base comprising the steps of:

detecting the position of said member relative to said base; and providing a control signal to said movable member to move said movable member to a desired position on said base, said control signal being such that the relative difference in the velocity of said base and said movable member is zero at the time said movable member reaches said desired position, and said control signal being provided to move said movable member such that the velocity of said movable means and of said base is finite at the time said movable member reaches said desired position.

11. The method according to claim 10 further including the step of providing a filter formula, said control signal being provided in response to said filter formula and said detected position.

12. The method according to claim 10 wherein said step of providing a filter formula includes calculating said filter signal for reducing the error between the desired displacement and the actual displacement of said movable member and for providing said calculated signal to said means for generating.

13. The method according to claim 12 wherein said step of calculating said filter signal includes reducing the energy to move said member from the initial position to the desired position of said movable member within a certain time period.

* * * * *